US010855322B2

(12) United States Patent
Chang (10) Patent No.: US 10,855,322 B2
(45) Date of Patent: Dec. 1, 2020

(54) INFORMATION HANDLING SYSTEM RADIO TRANSMIT POWER MANAGEMENT

(71) Applicant: Dell Products L.P., Round Rock, TX (US)

(72) Inventor: Ching Wei Chang, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 69 days.

(21) Appl. No.: 16/221,046

(22) Filed: Dec. 14, 2018

(65) Prior Publication Data
US 2020/0195289 A1 Jun. 18, 2020

(51) Int. Cl.
| H01Q 1/24 | (2006.01) |
| H04B 1/3827 | (2015.01) |
| H04W 52/18 | (2009.01) |
| H03K 17/955 | (2006.01) |
| G06F 1/16 | (2006.01) |
| H01Q 5/378 | (2015.01) |
| G01R 27/26 | (2006.01) |

(52) U.S. Cl.
CPC ......... *H04B 1/3838* (2013.01); *G06F 1/1698* (2013.01); *H01Q 1/24* (2013.01); *H03K 17/955* (2013.01); *H04W 52/18* (2013.01); *G01R 27/2605* (2013.01); *H01Q 5/378* (2015.01)

(58) Field of Classification Search
CPC ...... H01Q 1/24; H01Q 1/2258; H01Q 1/2266; H01Q 5/378; H01Q 1/243; H01Q 1/245; H01Q 1/523; H01Q 21/28; H04B 1/3838; H04W 52/18
See application file for complete search history.

(56) References Cited

U.S. PATENT DOCUMENTS

| 6,380,930 B1 | 4/2002 | Van Ruymbeke |
| 6,765,536 B2 | 7/2004 | Phillips et al. |
| 9,203,137 B1* | 12/2015 | Guterman ............ H01Q 1/2266 |
| 2008/0062065 A1 | 3/2008 | Yamamoto et al. |
| 2010/0112833 A1 | 5/2010 | Jeon |
| 2015/0171916 A1* | 6/2015 | Asrani ................ H04M 1/0202 |
| | | 455/575.7 |
| 2018/0040942 A1* | 2/2018 | Lepe .................... H01Q 1/2266 |
| 2018/0316379 A1* | 11/2018 | Chang .................... H04B 1/401 |

OTHER PUBLICATIONS

Semtech, "Semtech SX9306 Ultra Low Power SAR Proximity Sensor," downloaded from https://www.mouser.com/new/semtech/semtech-sx9306-sar-sensor/ on Dec. 13, 2018, 2 pages.
Toit, R., "Using proximity sensing to meet mobile device FCC SAR regulations," Apr. 17, 2012, downloaded from https://www.embedded.com/design/connectivity/4371201/1/Using-proximity-sensing-to-meet-mobile-device-FCC-SAR-regulations, 4 pages.

* cited by examiner

*Primary Examiner* — Hoang V Nguyen
(74) *Attorney, Agent, or Firm* — Zagorin Cave LLP; Robert W. Holland (57) ABSTRACT

An information handling system transceiver adjusts power levels for transmitting wireless signals to maintain specific absorption constraints by estimating the type of material proximate an antenna and applying the estimated material to adjust transmit power levels. When the capacitive response of an object in proximity to the antenna indicates an inanimate object, such as a desktop surface or a portion of a housing, the power level may be maintained at a high setting and remain within specific absorption constraints.

20 Claims, 5 Drawing Sheets

INFORMATION HANDLING SYSTEM RADIO TRANSMIT POWER MANAGEMENT

BACKGROUND OF THE INVENTION

Field of the Invention

The present invention relates in general to the field of information handling system wireless communication, and more particularly to information handling system radio transmit power management.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Portable information handling systems generally integrate processing components, a power source and input/output (I/O) devices in portable housings to support mobile performance of information processing tasks without cabled interfaces. Convertible information handling systems typically include a keyboard integrated in one housing portion and a touchscreen display integrated in a rotationally coupled housing portion. The housing portions rotate between a closed position having the display closed over the keyboard for approximately 90 degrees to a clamshell position having the display held in a viewing position over the keyboard. In the closed position, the portable information handling system has a minimal size to enhance portability and protect the display and keyboard against damage. In the clamshell position, the keyboard keys are disposed horizontally relative to the display to accept end user inputs while the end user views the display. Further rotation of the housing portions by up to 360 degrees to a tablet position exposes the touchscreen display to accept touch inputs with the keyboard rotated underneath the system and out of the way.

Generally, to communicate with external networks and peripherals while operating in a mobile mode, portable information handling systems integrate wireless communication devices. Most commonly, portable information handling systems include wireless local area network (WLAN) transceivers that support Internet communications through WiFi hotspots. Wireless Internet access allows an end user to access email, web browsing and network storage while operating in a mobile mode. Also common are wireless personal area network (WPAN) transceivers that support wireless communication with peripheral devices, such as Bluetooth communication to a keyboard and/or mouse. In addition, some portable information handling systems included wireless wide area network (WWAN) transceivers that support wireless communication through wireless networks of telephony providers, such as through cellular towers. WWAN access is typically provided through a contract with the telephony provider that provides a telephony infrastructure for wide ranging wireless access similar to that of mobile telephones.

One difficulty that arises with wireless communication is that radiofrequency transmissions near human skin are limited by government regulations based upon specific absorption of the wireless signal. Typically, information handling systems include proximity sensors integrated with or near the transmitting antenna so that transceiver output can decrease if human proximity is detected. Reducing the transmission power helps to maintain specific absorption constraints while full transmission power remains available when human proximity is not detected. Proximity sensing typically relies upon capacitance detection because of near field effects and the changes in capacitance due to human proximity. Human proximity to the capacitance sensors will cause a change in capacitance due to additional dielectric loading from human tissue onto the capacitance sensors, causing a trigger for RF transmission power reductions Although proximity detection helps to maintain specific absorption constraints, in some instances proximity detection unnecessarily restricts transmission power, such as when a non-human object comes into proximity with the antenna.

SUMMARY OF THE INVENTION

Therefore, a need has arisen for a system and method which manages wireless transmission power based upon the type of object detected proximate an antenna.

In accordance with the present invention, a system and method are provided which substantially reduce the disadvantages and problems associated with previous methods and systems that manage wireless transmission power at an information handling system. A proximity sensor detects a capacitance response at an antenna disposed in the information handling system to estimate a material type of an object proximate the antenna and manages power transmitted from the antenna based upon the material type to maintain predetermined specific absorption constraints.

More specifically, an information handling system processes information with processing components disposed in a housing and communicates the information with a radio transceiver, such as through a wireless wide area network. For example, a main housing portion containing a central processing unit and memory rotationally couples to a lid housing portion containing a display, such as with a hinge that rotates the main and lid housing portions 360 degrees relative to each other between closed and tablet positions. A main and auxiliary LTE antenna located in the main housing portion between the hinge interface with the radio to transmit wireless signals at plural power levels and are isolated from each other by a parasitic element disposed between the main and auxiliary antenna. A capacitive proximity sensor couples to at least one antenna and the parasitic element to detect a capacitive response, such as is introduced by mutual coupling from an object proximate the at least one antenna and parasitic element. The capacitive proximity sensor estimates a material type of the object and applies the material type to manage wireless signal transmission power level, such as maintaining power of the wireless signals if the object material type is not human or otherwise associated with specific absorption constraints.

The present invention provides a number of important technical advantages. One example of an important technical advantage is that a proximity sensor near an antenna detects a type of material in proximity to the antenna to better determine when transmission power reductions are needed to meet specific absorption constraints. For instance, rotation to a tablet position that brings a metal housing portion in proximity to an antenna is distinguished from proximity to human body parts so that greater transmission power may be maintained. Capacitance measurements across plural sensors are compared to identify object size and material and further adjust proximity sensing to achieve improved radio performance.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A portable information handling system communicates wireless signals with power level adjusted to meet specific absorption constraints based upon the type of material of an object detected proximate an antenna. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
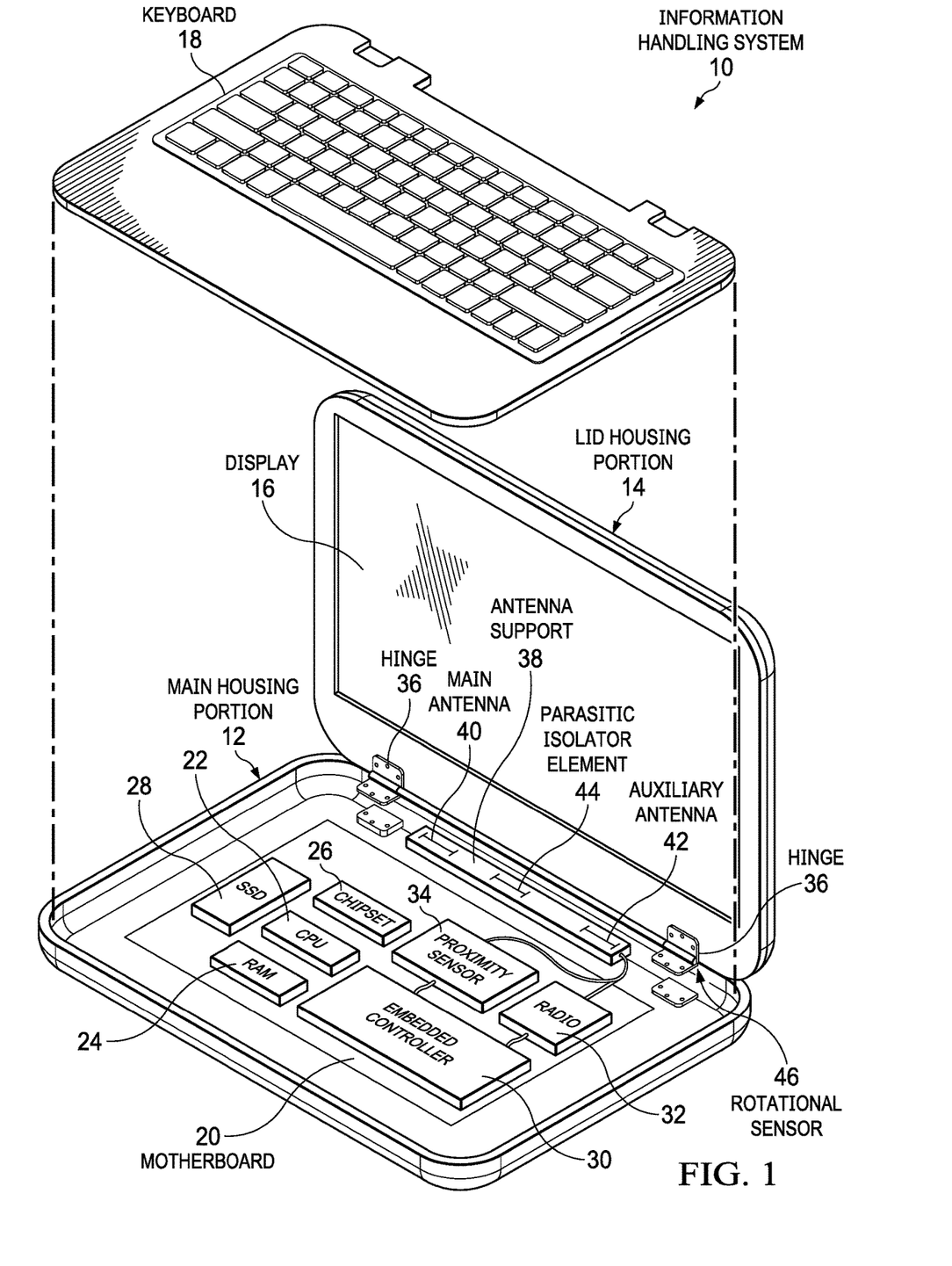
FIG. 1 depicts a top view of a portable information handling system configured to estimate a material type for adjusting wireless signal transmission power levels.

Referring now to FIG. 1, a top view depicts a portable information handling system 10 configured to estimate a material type for adjusting wireless signal transmission power levels. In the example embodiment, portable information handling system 10 has a main housing portion 12 rotationally coupled to a lid housing portion 14 that contain processing components for processing information. A display 16 integrates in lid housing portion 14 to present information as visual images. A keyboard 18 couples over the top of processing components disposed in main housing portion 12 and accepts end user inputs as key presses. In the example embodiment, display 16 is held in a vertical position relative to keyboard 18 so that an end user can type inputs at keyboard 18 in a horizontal configuration while viewing visual images at display 16 in a vertical configuration. This "clamshell" position transitions to a closed position by rotating display 16 downward towards keyboard 18 so that display 16 and keyboard 18 are hidden and protected, such as for storage and transportation.

In the example embodiment, information handling system 10 has a motherboard 20 coupled to main housing portion 12 that interfaces the processing components. A central processing unit (CPU) 22 coupled to motherboard 20 executes instructions that process information, with the instructions and information stored in random access memory (RAM) 24. A chipset 26 manages CPU 22 operations, such as to control clock speeds and memory access. As an example, an operating system and applications stored in persistent memory of a solid state drive (SSD) 28 are retrieved to RAM 24 with pre-boot and BIOS instructions executed by embedded controller 30 to bring CPU 22 into an operational state. Information processed by CPU 22 is presented at display 16 with integrated graphics processing supported through chipset 26 or, alternatively, with processing provided by a dedicated graphics processor unit (GPU).

In the example embodiment, portable information handling system 10 communicates with external networks and peripherals through a radio 32 interfaced with CPU 22 and embedded controller 30 by motherboard 20. For instance, radio 32 communicates with a wireless wide area network (WWAN) using the LTE protocol at an integrated transceiver. Radio 32 interfaces with an antenna support 38 coupled between hinges 36 that rotationally couple lid housing portion 14 to main housing portion 12. Antenna support 38 supports a main LTE antenna 40 at one end, an auxiliary LTE antenna 42 at the opposite end and a parasitic isolator element 44 between antenna 40 and 42. Antenna support 38 is disposed along one side of main housing portion 12, such as below window material that is transparent to radiofrequency energy. Including antenna support 38 in main hosing 12 instead of lid housing 14 allows a reduced bezel size around display 16, however, presents difficulty in ensuring that specific absorption constraints are met with respect to radio frequency energy released from antenna 40 and 42. For example, in the clamshell mode, an end user may place information handling system 10 on a desktop surface or on a lap. If antenna 40 and 42 rest on a person, radiofrequency energy transmitted at full power settings may result in exposure to the person that exceeds specific absorption constraints.

Figure 2:
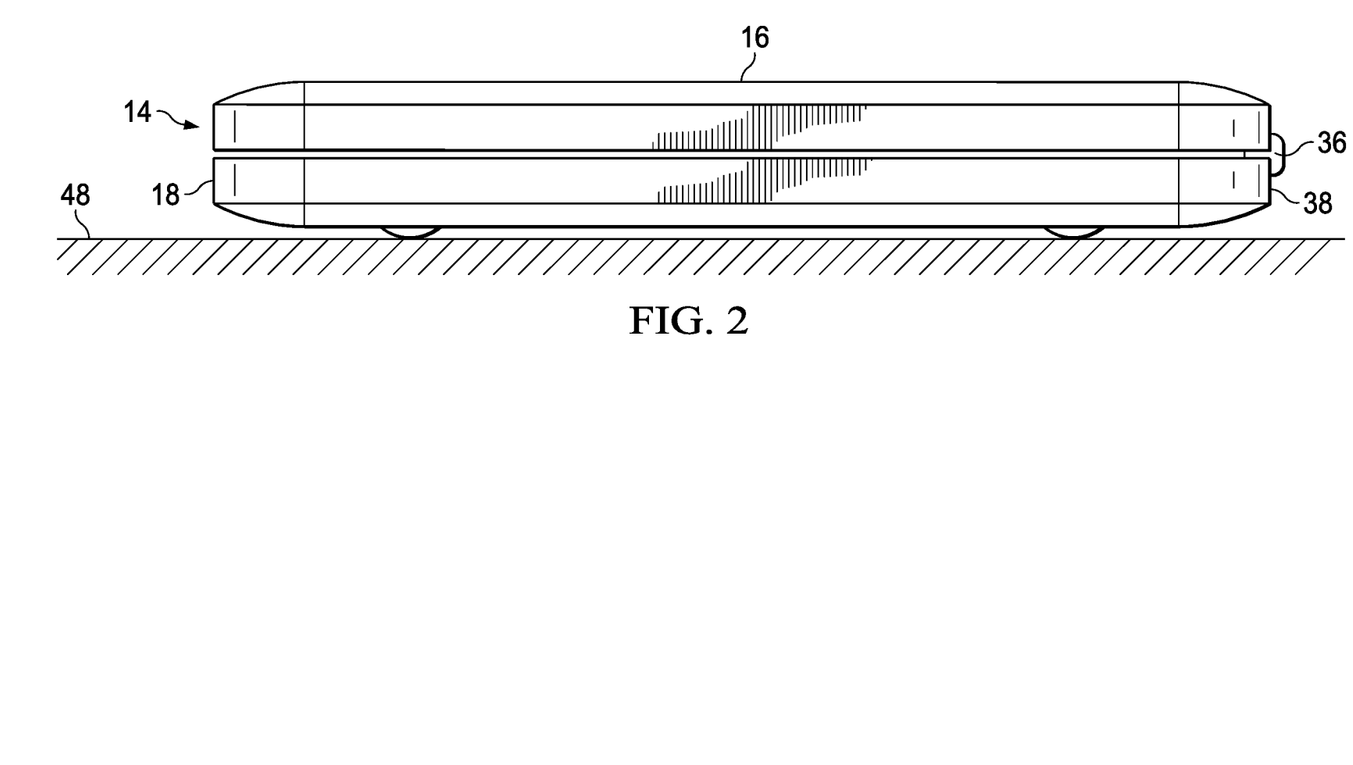
FIG. 2 depicts a side view of the information handling system in a tablet position.

Referring now to FIG. 2, a side view depicts information handling system 10 in a tablet position instead of the clamshell position depicted by FIG. 1. In the tablet position, display 16 is exposed for use as a touchscreen while keyboard 18 rotates under information handling system 10 to rest against a support surface 48. As with the clamshell mode, in the tablet mode antenna 40 and 42 may exceed specific absorption constraints if keyboard 18 rests on an end user, such as in a lap. In contrast, if information handling system 10 rests on support surface 48, radiofrequency energy may be transmitted at full power settings without exceeding specific absorption constraints. In addition, the relative position of the housing portions may impact antenna performance. For instance, with thin height systems, housing portions 12 and 14 are often made of metallic material, such as aluminum, to provide a robust housing that will sustain repeated torsional stresses related to rotational movement.

Referring back to FIG. 1, a proximity sensor 34 couples to motherboard 20 and interfaces with radio 32 to manage wireless signal transmission power levels so that specific absorption constraints are met. For instance, proximity sensor 34 is the SX9324 sold by SEMTech. In the example embodiment, proximity sensor 34 interfaces with auxiliary antenna 42 and parasitic element 44 to measure changes in capacitance, such as are induced by proximity of an object to antenna 42 and parasitic element 44. In an alternative embodiment, proximity sensor 34 may also interface with main antenna 40 to provide three separate measurement channels of capacitance. Although proximity sensor 34 is depicted as a separate integrated circuit, in an alternative embodiment it may be included with radio 32, such as to provide antenna tuning in response to near field effects. Proximity sensor 34 includes instructions that execute on embedded controller 30 and CPU 22, which collectively control power levels of wireless signals transmitted by radio 32. For instance, proximity sensor 34 may have a capacitance trigger set that issues an interrupt to radio 32 if a predetermined capacitance is measured so that radio 32 reduces transmission power levels while the predetermined capacitance is detected by proximity sensor 34. In turn, the predetermined capacitance that issues the interrupt may be set by firmware instructions of embedded controller 30 or operating system instructions of CPU 22. Alternatively, proximity sensor 34 may report detected capacitance to embedded controller 30 so that embedded controller 30 commands the power level of radio 32. The distribution of proximity sensor instructions may vary depending on the type of control desired and the interface of other sensors that impact how radio power levels are selected. For instance, in the example embodiment a rotational sensor 46 detects the relative rotational position of lid housing portion 14 and main housing portion 12 to embedded controller 30 for use in setting power levels by embedded controller 30 as described below.

One difficulty in selection of wireless signal power transmission levels is that metal used in housing portions 12 and 14 introduce capacitance at antenna 40 and 42 similar to that introduced by a human touch. As lid housing portion 14 rotates relative to main housing portion 12, capacitive response detected by proximity sensor 34 changes, which could trigger a reduction in power levels by radio 32 without a need for a power reduction since no human body part has approached antenna 40 and 42. To manage changes in capacitance associated with housing relative rotational orientation, embedded controller 30 monitors rotational orientation reported by rotational sensor 46 and adjusts a capacitance level of proximity sensor 34 used to trigger power level changes for transmissions from radio 32. For instance, in the clamshell position depicted by FIG. 2, the edge of lid housing portion 14 rotates somewhat distal to antenna 40 and 42 so that the capacitance response introduced by lid housing portion 14 is reduced by the increased distance and perpendicular orientation. In contrast, in the tablet configuration depicted by FIG. 2 lid housing portion 14 rotates into close proximity with antenna 40 and 42 in a parallel orientation that increases the capacitance response introduced at proximity sensor 34. Rotational sensor 46 monitors relative rotational orientation of housing portions 12 and 14 and adjusts the capacitive response at proximity sensor 34 that triggers power level reductions. Once the relative rotational orientation of housing portions 12 and 14 are applied to adjust the capacitive response, additional capacitance associated with a human touch near antenna 40 and 42 will trigger radio power transmission reductions. Capacitance response settings will depend on implementation details for the information handling system, such as the type of material used in lid housing portion 14, the height of the housing, the rotational circumference of hinge 36 and the type of hinge. For instance, a synchronous hinge that rotates dual axles simultaneously will have a different path during rotation compared with a sequential hinge that rotates about the dual axles in turn, and the distance of each path impacts the capacitive response introduced by the lid housing material.

Another difficulty in selection of wireless signal power transmission levels is that an object that introduces a capacitive response at proximity sensor 34 may not be a human body part so that power level reductions in wireless transmissions are initiated in response to inanimate objects. As an example, information handling system 10 may rest on a support surface 48 instead of on a human lap or held by a human grasp. To better manage radio power transmission levels, proximity sensor 34 estimates the type of material detected in proximity to it and adjusts capacitive response to account for the material type and remain available to detect human body parts. As one example, proximity sensor 34 stores capacitive response associated with various materials and estimates a material in proximity to it by comparison of the detected capacitive response with the stored capacitive response. One example of this approach is storing the capacitive response of the lid housing portion 14 at various rotational orientations as described above. In addition, capacitive response may be stored for various desktop materials, such as metal and wood. For instance, information handling system 10 is placed on a wood desktop in the clamshell and tablet modes to measure the capacitive response and store the capacitive response in embedded controller 30. In a resting position on a desktop, the capacitive response is repeatable so that a match between a detected capacitive response and a stored capacitive response indicates a desktop resting position on the associated material. Similarly, capacitance response in a lap may be stored for comparison with a detected capacitive response to initiate transmission power reductions when detected. In one embodiment, the comparison of a detected capacitive response against a stored response includes a comparison of capacitive response on multiple channels for similarity. That is, on a desktop each of the channels associated with antenna 42 and parasitic element 44 will have a similar response where the desktop material is uniform with respect to each channel. If a non-uniform capacitive response is detected at different channels, a human object may be estimated, resulting in power reductions. In one example embodiment, accelerometer inputs may provide an additional indication of object material type for proximity sensor 34. For instance, a capacitance response match with a wood desktop may instead be treated as human object if detected accelerations indicate human contact.

In addition, capacitive response may be manipulated to further narrow material type of an object in proximity to antenna 40 and 42. For instance, proximity detection of a human object typically relies upon detection of mutual coupling between the human object and a proximity sensor body, such as antenna 42 and parasitic element 44 in the example embodiment. Mutual coupling is detected based upon changes to capacitance introduced at proximity sensor 34 when a human object comes into proximity to the proximity sensor body. The amount of change in capacitance depends upon the material type of the object, the distance of the object to the proximity sensor body, as well as other factors, such as material medium and temperature. Generally mutual coupling will occur if an object has a dielectric different than air, with the amount mutual coupling varying based upon distance to the object and dielectric of the object. To estimate material type, proximity sensor 34 adjusts sensing factors and analyzes changes to capacitive response. For instance, proximity sensor 34 may adjust the detection threshold at which objects are detected. This is done by optimizing the detection sensitivity of the proximity sensor. Different threshold settings will result in high or low feedback sensitivity of the capacitance change detected, and ultimately this change can be used to predict if power cutback is required or not. This threshold setting can further be optimized to allow for capacitance changes to be detected with high sensitivity or low sensitivity based on its usage environment or location.

Figure 3:
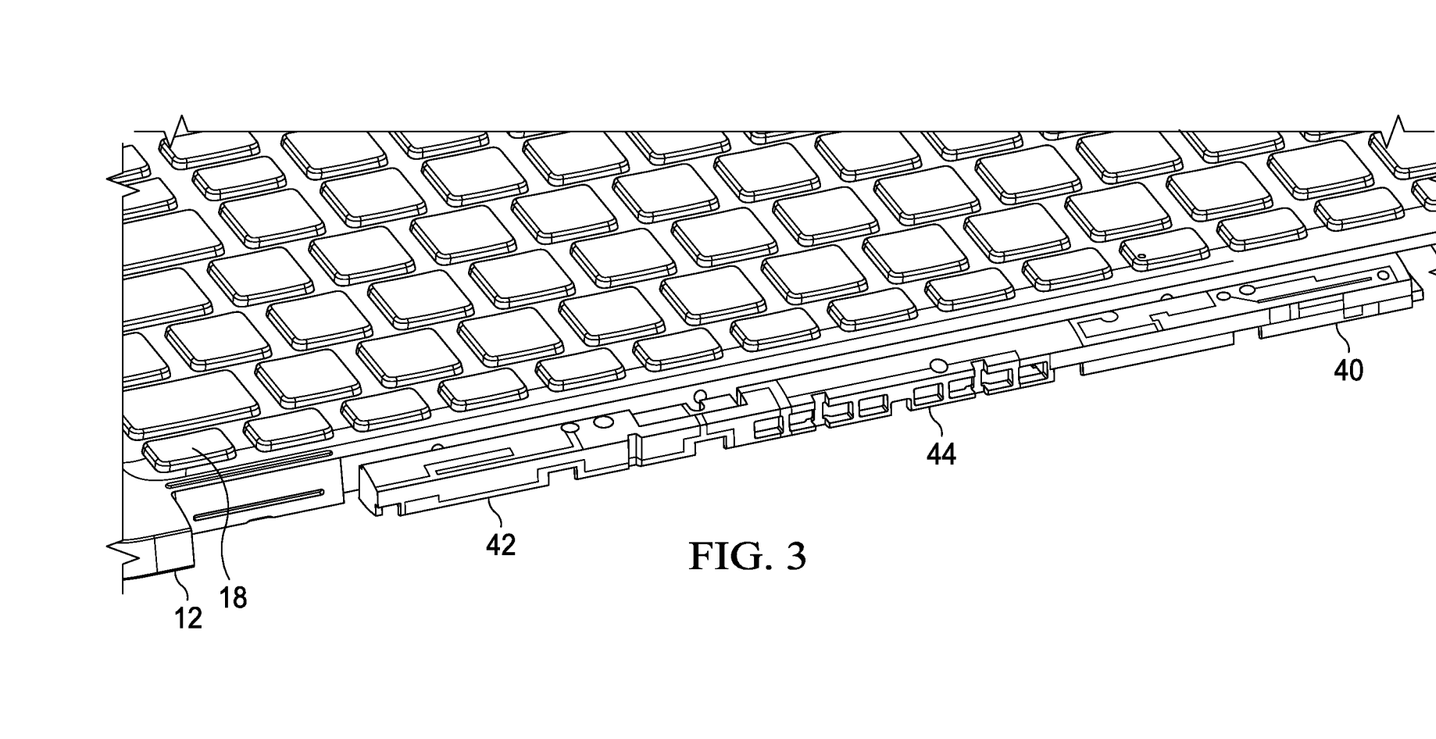
FIG. 3 depicts a rear cutaway view of the antenna coupled at a rear side of a main housing portion of the information handling system.

Referring now to FIG. 3, a rear cutaway view depicts antenna support 38 coupled at a rear side of a main housing portion 12 of information handling system 10. In the example embodiment, main antenna 40 and auxiliary antenna 42 have elements in a plane parallel with keyboard 18 and perpendicular to keyboard 18. Antenna support 38 extends parasitic element 44 plus antenna 40 and 42 outward and away from main housing portion 12 to provide a wireless signal path. The positions of antenna 40 and 42 are closer to a lid housing portion 14 in closed and clamshell positions and farther in a tablet position. However, in the tablet position, antenna 40 and 42 rest in close proximity to a support surface. In various other embodiments, the relative position of antenna 40 and 42 are taken into account when adjusting the capacitive response of a proximity sensor.

Figure 4:
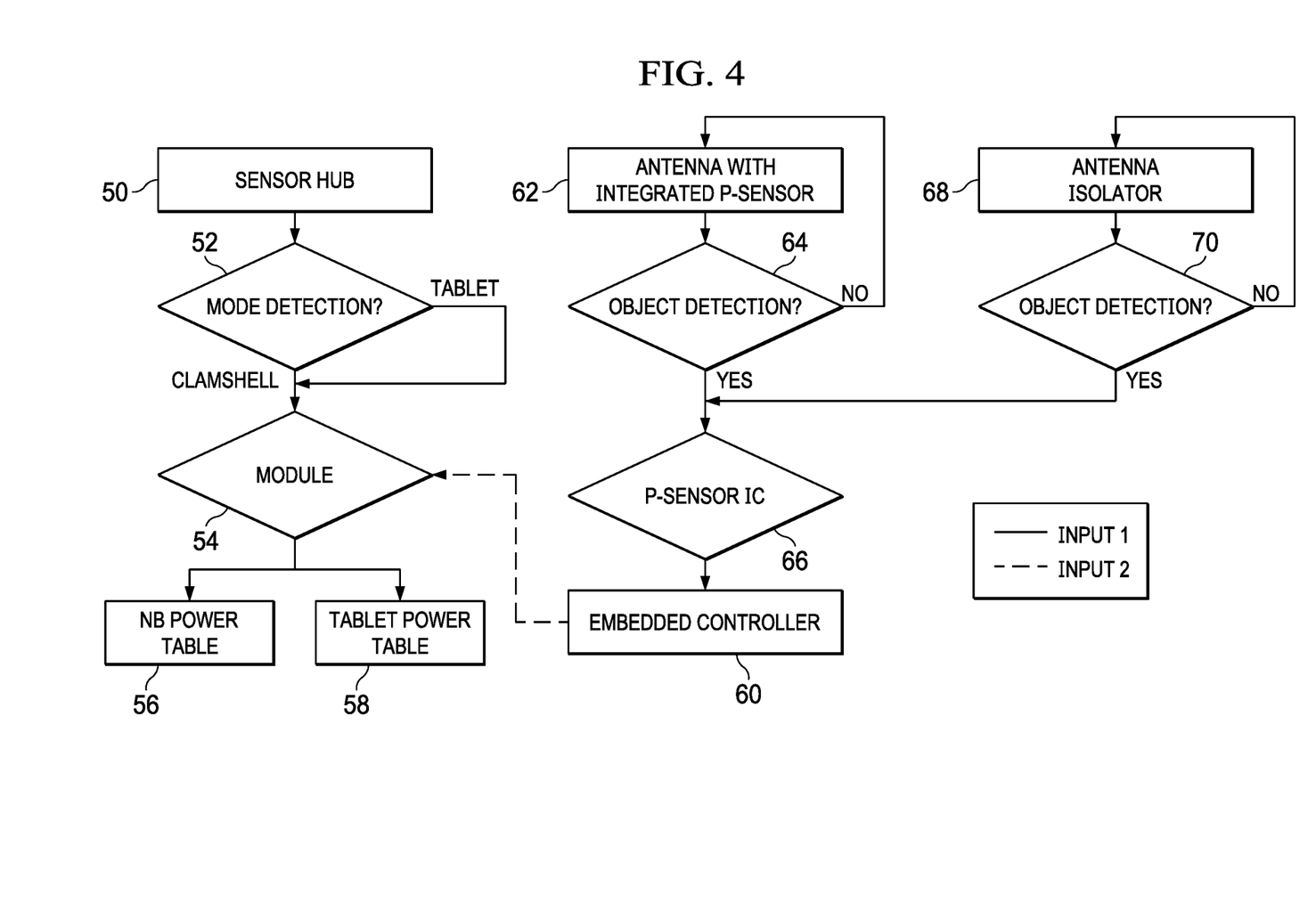
FIG. 4 depicts a flow diagram of a process for adjusting power of wireless signals based upon proximity of an object detected at an antenna.

Referring now to FIG. 4, a flow diagram depicts a process for adjusting power of wireless signals based upon proximity of an object detected at an antenna. The process starts at step 50 with monitoring of a sensor hub that detects relative rotational orientation of housing portions of an information handling system. For example, the sensor hub may be one or more Hall sensors that provide signals upon alignment with magnets that correspond to defined rotational orientations. At step 52 a determination is made of whether the housing portions are oriented in a clamshell or tablet mode and set in a control module at step 54. If in a clamshell mode, a notebook power table 56 is accessed with radio transmit power levels associated to capacitance responses expected from proximity of the lid housing portion relative to the antenna in a clamshell orientation. If in a tablet mode, a tablet power table 58 is accessed with radio transmit power levels associated to capacitance responses expected from rotation of the lid housing portion 360 degrees relative to the main housing portion. At step 54, the appropriate power table is provided to the embedded controller 60.

At step 62, the antenna interfaced with the proximity sensor is monitored for object detection. For instance, at step 64 a capacitance response greater than a minimum threshold is reported at step 66 to the proximity sensor integrated circuit. Similarly, at step 68 the parasitic isolator element is monitored for capacitance response that exceeds a threshold at step 70, which is reported to the proximity sensor at step 66. At step 60, the embedded controller accepts the proximity sensor output and compares the proximity sensor output to the appropriate power table to determine if a radio transmit power level reduction should be commanded. As set forth above, a comparison between the capacitance response of the antenna and the antenna isolator aids in a determination of whether a shared object is detected by both, such as a desktop, or a separate object, such as a hand. Further a comparison between known material types and detected proximity allows embedded controller 60 to distinguish between various expected types of materials, such as wood or metal desktops compared with a human lap.

Figure 5:
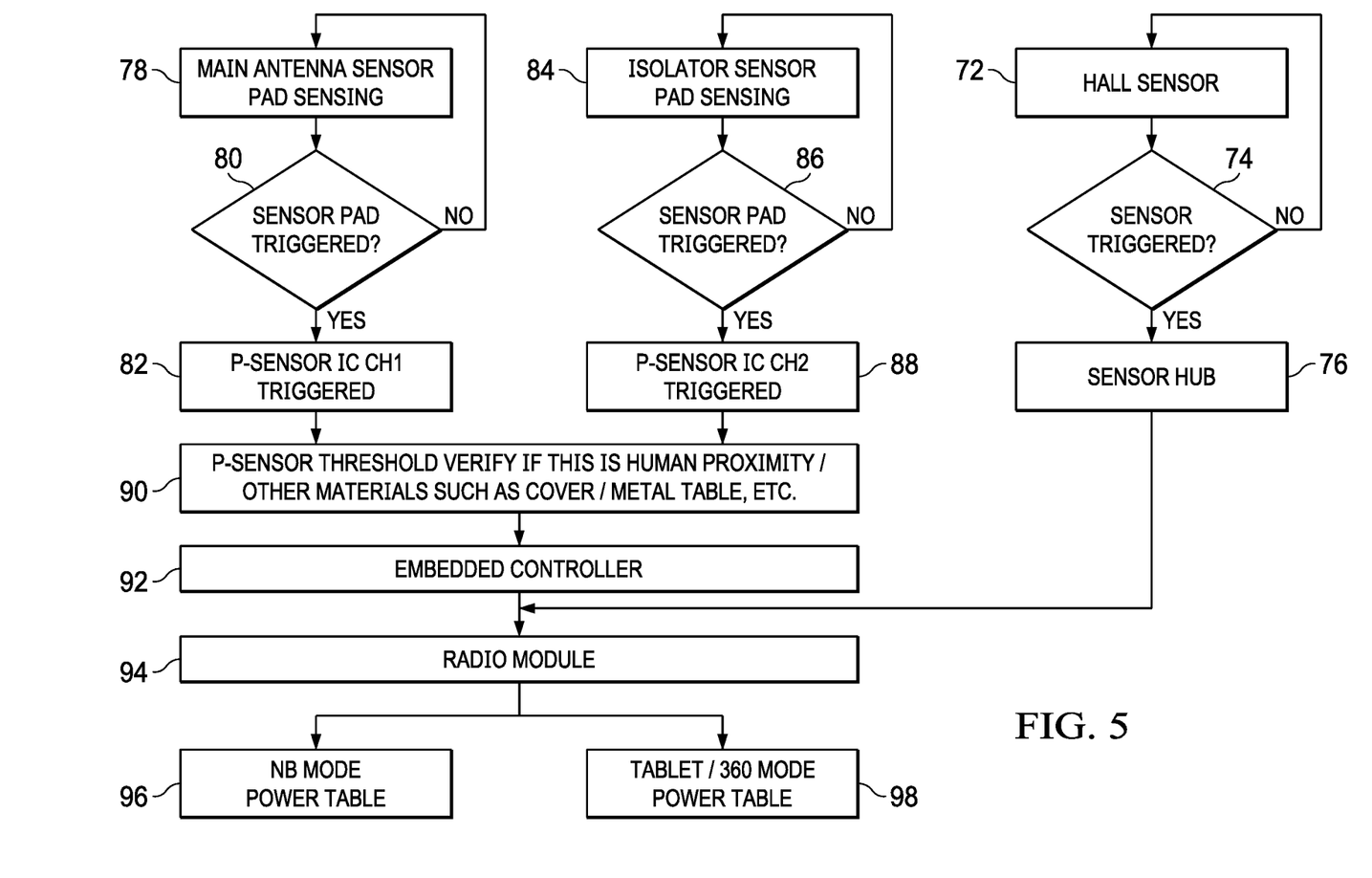
FIG. 5 depicts a functional block diagram for adjusting power of wireless signals based in part upon rotational position of housing portions and proximity of an object.

Referring now to FIG. 5, a functional block diagram depicts adjusting power of wireless signals based in part upon rotational position of housing portions and proximity of an object. The process starts at step 72 with monitoring of a Hall sensor so that at step 74 triggering of the sensor communicates detected rotational orientation to a sensor hub at step 76. At step 78, the main antenna is monitored for capacitance response at step 80 so that the proximity sensor channel interfaced with the main antenna indicates a proximity detection at step 82. Similarly, at step 84, the parasitic isolator element is monitored for capacitance response at step 86 so that the proximity sensor channel interfaced with the parasitic element indicates a proximity detection at step 88. At step 90, each channel received at the proximity sensor is analyzed to determine if the object detected in proximity is human or inanimate, such as a cover or support surface. The result of proximity detection is forwarded to an embedded controller at step 92 to determine if a transmit power level reduction threshold is met. The embedded controller provides the proximity detection results at step 94 to the radio module, which compares the detected objects to the sensed rotation orientation to determine if a power level reduction or increase should be commanded. In the example embodiment of FIG. 5, proximity sensor logic resides on the radio module at step 94, which retrieves expected capacitance response from a notebook mode power table at step 96 or a tablet mode power table at step 98 based upon the rotational orientation reported from the sensor hub at step 76.

Although the present invention has been described in detail, it should be understood that various changes, substitutions and alterations can be made hereto without departing from the spirit and scope of the invention as defined by the appended claims.

What is claimed is:

1. An information handling system comprising:
   a lid housing portion;
   a main housing portion;
   a hinge rotationally coupling the housing portion and main housing portion to rotate from a closed position for substantially 360 degrees to a tablet position;
   a display integrated in the lid housing portion;
   processing components disposed in the main housing portion, the processing components operable to process information and including at least a transceiver that transmits wireless signals;
   one or more antenna disposed in the main housing portion and interfaced with the transceiver to transmit the wireless signals; and
   a proximity sensor interfaced with transceiver and operable to detect a capacitance proximate the one or more antenna, estimate a material associated with the capacitance, and manage transmission power at the transceiver based at least in part upon the estimate of the material.

2. The information handling system of claim 1 further comprising:
a rotational sensor operable to detect a rotational orientation of the lid housing portion relative to the main housing portion;
wherein the rotational sensor interfaces with the proximity sensor to adjust proximity detection based upon the position of the lid housing portion relative to the antenna.

3. The information handling system of claim 1 wherein the one or more antenna comprise first and second antenna coupled to one side of the main housing portion proximate the hinge, the information handling system further comprising a parasitic element disposed between the first and second antenna, the proximity sensor coupled to at least one of the antenna and the parasitic element to sense capacitance.

4. The information handling system of claim 3 wherein the proximity sensor estimates material in part by comparing capacitance at the at least one antenna and parasitic element.

5. The information handling system of claim 3 wherein the proximity sensor estimates material in part by comparing detected capacitance against a maximum expected capacitance for a human body.

6. The information handling system of claim 3 wherein the proximity sensor estimates material as a wood desktop supporting the main housing portion if the detected capacitance has a predetermined value.

7. The information handling system of claim 3 wherein the proximity sensor estimates material as a metal desktop supporting the main housing portion if the detected capacitance has a predetermined value.

8. The information handling system of claim 7 wherein the proximity sensor adjusts the predetermined value based upon whether the main and lid housing portions rotate to a clamshell or tablet mode.

9. The information handling system of claim 3 wherein the proximity sensor couples to both antenna and the parasitic element.

10. A method for managing wireless signal power transmission from an information handling system antenna, the method comprising:
detecting changes in capacitance proximate the antenna with a capacitive response of a capacitive proximity sensor;
estimating a material type associated with the changes in capacitance; and
adjusting wireless signal transmission power based at least in part upon the estimated material type.

11. The method of claim 10 wherein estimating a material type further comprises:
changing a sensitivity of the capacitance proximity sensor; and
comparing the capacitance response at different sensitivities.

12. The method of claim 10 further comprising:
detecting a relative rotational position of housing portions of the information handling system; and
adjusting the capacitance response based upon the detected relative rotational position to increase a capacitive response threshold at which transmission power is reduced.

13. The method of claim 10 wherein adjusting wireless signal transmission power further comprises:
reducing transmission power at a first capacitive response threshold if the estimated material is metal; and
reducing transmission power at a second capacitive response threshold if the estimated material is human.

14. The method of claim 10 wherein detecting changes in capacitance proximate the antenna further comprises:
interfacing the capacitive proximity sensor with the antenna;
interfacing the capacitive proximity sensor with a parasitic isolation element disposed proximate the antenna; and
monitoring capacitive response at each of the antenna and the parasitic isolation element.

15. The method of claim 10 wherein estimating a material type further comprises:
comparing the capacitive response of the antenna and a parasitic isolation element; and
estimating a predetermined material if the capacitive response of the antenna and the parasitic element have a predetermined similarity.

16. The method of claim 10 wherein estimating a material type further comprises alternating the capacitive sensor between inductive proximity detection and mutual capacitance proximity detection.

17. The method of claim 10 wherein estimating the material type associated with the changes in capacitance further comprises distinguishing between a material from which a housing of the information handling system was constructed and an external material.

18. A radio comprising:
a transceiver operable to transmit wireless signals at plural power levels;
first and second antenna interfaced with the transceiver and operable to transmit the wireless signals;
a parasitic element disposed between the first and second antenna and operable to isolate the first and second antenna from each other; and
a proximity sensor interfaced with at least one antenna and the parasitic element, the proximity sensor estimating a material type of an object proximate the at least one antenna and parasitic element and applying the estimated material type to manage the power level of the transceiver to transmit the wireless signals.

19. The radio of claim 18 wherein the proximity sensor estimates the material by changing a sensitivity applied for the capacitive sensing.

20. The radio of claim 18 wherein the proximity sensor estimates the material by alternating between inductive capacitance detection and mutual capacitive detection.

* * * * *